United States Patent [19]

Palvolgyi

[11] Patent Number: 4,535,466
[45] Date of Patent: Aug. 13, 1985

[54] RANDOM TIMER

[75] Inventor: Frank A. Palvolgyi, Granville, Ohio

[73] Assignee: The United States of America as represented by the Secretary of the Air Force, Washington, D.C.

[21] Appl. No.: 521,803

[22] Filed: Aug. 10, 1983

[51] Int. Cl.³ ............................................ H03K 21/14
[52] U.S. Cl. ...................................... 377/54; 377/109; 377/56; 331/78; 364/717
[58] Field of Search .......................... 377/54, 109, 56; 328/129.1; 331/78; 364/717

[56] References Cited

U.S. PATENT DOCUMENTS

| | | | |
|---|---|---|---|
| 3,614,399 | 10/1971 | Linz | 331/78 |
| 3,703,649 | 11/1972 | Maida | 307/293 |
| 3,777,278 | 12/1973 | Majeau et al. | 364/717 |
| 3,961,169 | 6/1976 | Bishop et al. | 364/717 |
| 4,151,404 | 4/1979 | Harrington et al. | 364/717 |
| 4,168,525 | 9/1979 | Russell | 364/569 |
| 4,183,088 | 1/1980 | Simmons | 331/78 |
| 4,255,793 | 3/1981 | Nakamura | 377/54 |
| 4,280,063 | 7/1981 | Yokomori et al. | 307/141.4 |
| 4,291,386 | 9/1981 | Bass | 364/717 |
| 4,325,081 | 4/1982 | Abe et al. | 358/127 |
| 4,365,145 | 12/1982 | Frentress | 377/54 |

Primary Examiner—John S. Heyman
Attorney, Agent, or Firm—Donald J. Singer; Bernard E. Franz

[57] ABSTRACT

The timer generates a selected number of control pulses per hour, at unpredictable (pseudo-random) intervals, for use with a time lapse video tape recorder used for time studies. The hour is divided into equal intervals to provide the number of samples required per hour, and one trigger pulse is generated randomly timed within each interval. A noise generator drives a counter whose outputs are loaded every Nth clock pulse into an N-stage shift register. The contents of the shift register are shifted out serially at the clock frequency.

1 Claim, 4 Drawing Figures

RANDOM TIMER

RIGHTS OF THE GOVERNMENT

The invention described herein may be manufactured and used by or for the Government of the United States for all governmental purposes without the payment of any royalty.

BACKGROUND OF THE INVENTION

This invention relates to a random timer, and more particularly to a timer for controlling the operation of a video monitor/recorder device set up to conduct time studies.

Timer systems for controlling the operation of video recorders, and for many other purposes, are commonplace. This timer system was developed for use with a video monitor/recorder device set up to conduct time studies of clean room operations for the purpose of establishing valid labor standards. Originally, the video systems were intended to record continuously, producing a large number of frames representing clean room operations from which a small number of randomly selected frames were used as the sample population for the required statistical studies. This method required large amounts of video tape and manual effort. Samples taken at regular intervals were not acceptable since they tended to introduce bias in personnel work habits. Totally random sampling methods were also rejected since they could not be effectively related to real time without restricting the number of frames per hour, which then could occur within a short time interval leaving a large portion of the hour unmonitored; thereby, making the system predictable.

SUMMARY OF THE INVENTION

An object of the invention is to make the operation of time-study systems more economical, by eliminating the necessity of continuously recording and hand selecting random frames from large amounts of tape.

The timer system according to the invention divides a basic time period into equal intervals (as many as the number of samples required per basic time period) and generates one trigger pulse randomly time within each interval. The system includes a basic clock, a noise generator, a counter, and a shift register. In the particular embodiment the basic time period is one hour.

This system eliminates the possibility of grouping all pulses in one short time period leaving the rest of the hour un-monitored, as a totally random system might do. It also keeps the system from being predictable like equal interval timers would be.

DETAILED DESCRIPTION

Figure 1:
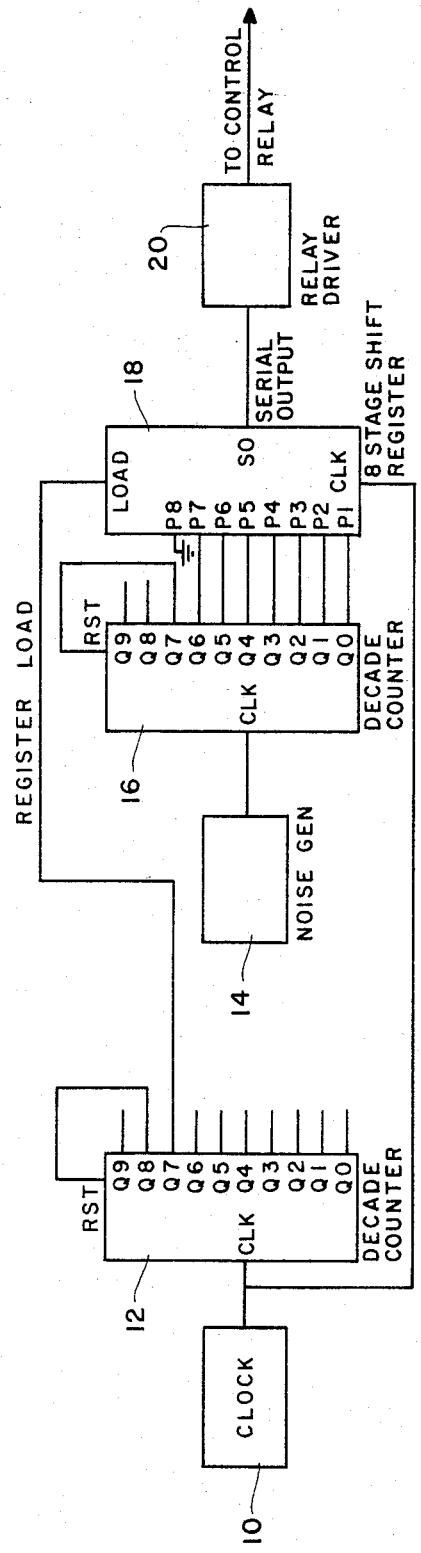
FIG. 1 is a block diagram of a timer system according to the invention.

FIG. 1 is a block diagram of a timer system for use with a video monitor/recorder device set up to conduct time studies of clean room operations for the purpose of establishing valid labor standards. The system comprises a clock 10 with a decade counter 12, a noise generator 14 with another decade counter 16, an 8-stage shift register 18, and a relay driver 20.

The clock 10 produces a very low frequency pulse train driving the counter 12, so that the outputs of the counter become true sequentially. The counter 10 is connected to reset itself after the eighth output becomes true, thus generating consecutive eight-bit "words". The clock frequency is trimmed to generate a number of these "words" equal to the number of samples required per hour. The digital noise generator 14 clocks counter 16, making its outputs sequentially high at a random frequency. Every eighth pulse of the clock enables the load control of the shift register 18. Since the parallel inputs P1 to P8 of the shift register 18 are connected to outputs of the counter 16, they will assume the state of the outputs of counter 16 at the upward transition of the load control. Note that each time the shift register 18 is loaded, one and only one of the stages 1 through 7 is high and stage 8 is low. The eight-bit word thus preserved will then appear bit by bit at its serial output on subsequent clock pulses. The input P8 of the shift register 18 is held at ground potential to separate last and first bits of consecutive patterns both of which may be high.

At 28 samples per hour, the clock frequency is 0.0622 Hertz. The above cycle repeats every eighth clock pulse since output Q8 of the counter 12 is connected to its reset terminal. Thus the frequency is effectively divided by eight, giving 0.00778 Hertz, which represents of period of 128.5714 seconds or 1/28 of an hour. The system thus produces 28 pulses per hour at intervals randomly varying between 32.14 seconds (two pulse periods) and 4.02 minutes (15 pulse periods). Timing accuracy of the system depends primarily on accuracy of the clock frequency and to a small (usually negligible) extent on delays introduced by the various components. (Number of decimals given above are usually not needed, and are given here to make the calculations conform to an accurate 3,600-second hour.) Other sample rates are generated by varying the clock's frequency by switching its feedback components.

Figure 2:
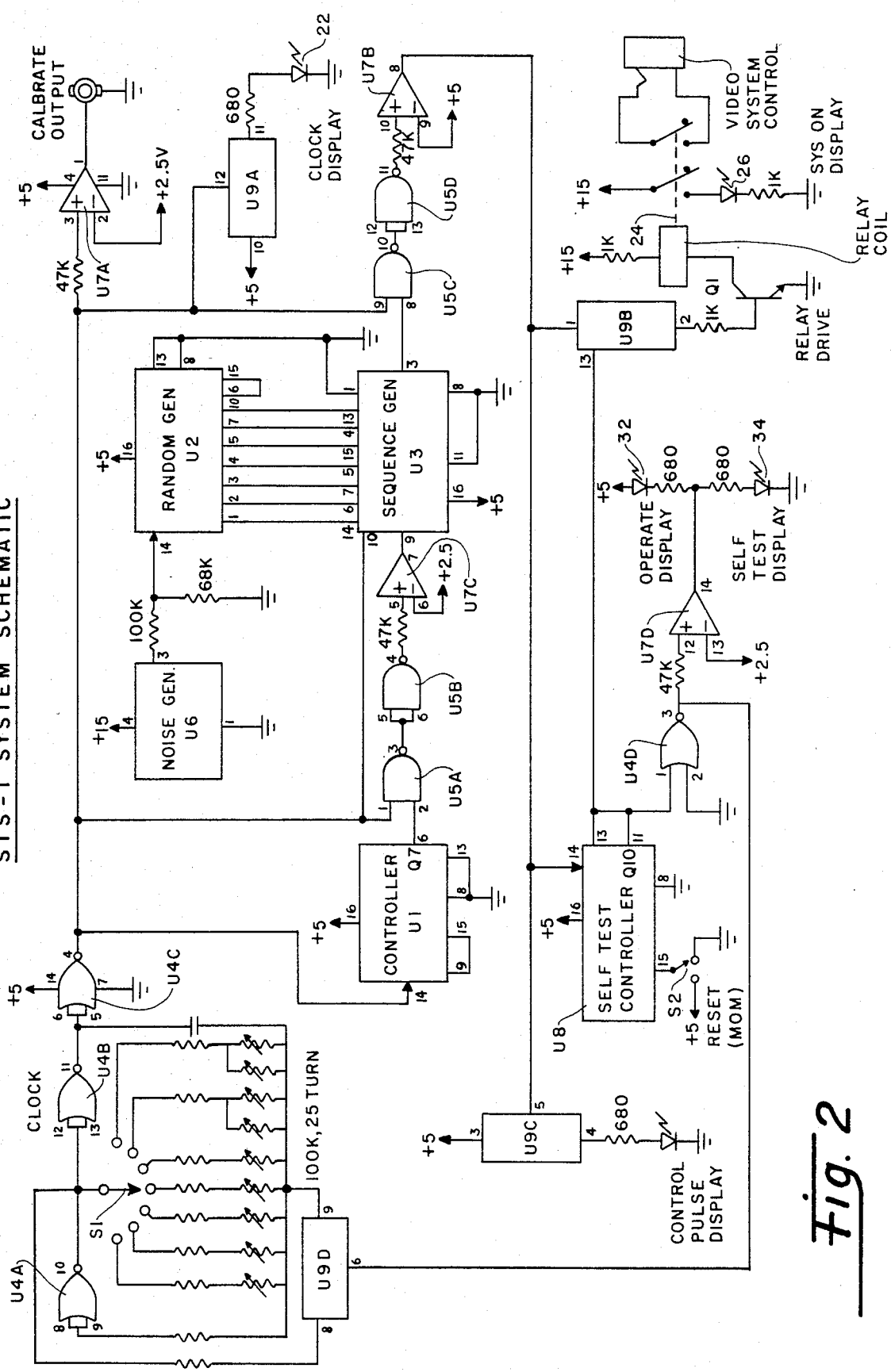
FIG. 2 is a functional block and schematic diagram of an emobodiment of FIG. 1.

FIG. 2 represents a detailed circuit diagram of a prototype timer system designed for use with a Panasonic NV 8030 time lapse VTR (video tape recorder), which will be compatible with most similar devices. The circuit comprises several integrated circuit (IC) devices and other components.

The clock 10 comprises NOR gates U4A and U4B with an RC feedback network. The output is coupled via NOR gate U4C to the controller or counter 12 comprising an IC U1. The system is designed to provide sample rates of 17, 20, 25, 28, 34, 42, and 50 frames per hour, selected by a seven position switch S1 in the clock's feedback network. Other rates can be achieved by changing feedback elements. Since no unusual timing accuracy was required for the particular application, the simple "NOR" gate oscillator shown was found satisfactory. (The system can be made extremely accurate by using a clock made of crystal oscillators with frequency dividers if such accuracy is desired.) The output of gate U4B and the input of gate U4A are connected respectively via a 47-microfarad tantalum capacitor and a 1.2 megohm resistor to a common junction point. The junction of gates U4A and U4B is connected to the moving contact of switch S1, and thence via the switch and resistors to the common junction point. Potentiometers of 100 K resistance and twentyfive turns each are used in each of the seven switch positions of the clock's feedback network to allow trimming its output frequency as required. The potentiometers in the sixth and seventh positions are each shunted by a 100 K resistor. The values of resistors in series with the potentiometers for the seven switch positions are respectively 220 K, 180 K, 150 K, 100 K, 68 K, 82 K, and 68 K. Buffered output of the clock signal from gate U4C is provided via a 47-K resistor and an operational amplifier IC device U7A to allow its comparison to external frequency standards. The clock output from gate U4C also operates an electronic switch IC U9A, which connects +5 volts via a 680-ohm resistor to a light emitting diode 22 for a clock display.

The NAND gates of an IC device U5 are used as delay and pulse shaper gates. An IC device U7 has three operational amplifiers used as buffers and one used as a light emitting diode driver. The Q7 output of the counter or controller U1 at pin 6 is coupled via gates U5A, U5B, a 47-K resistor, and amplifier U7D in tandem to the input at pin 9 of the shift register or sequence generator U3. The output of register U3 at pin 3 is provided via gates U5C, U5D, a 47-K resistor, and amplifier U7B in tandem. Gates U5A and U5C also each have an input from the clock gate U4C.

The noise generator 14 and its counter 16 used as a random generator are provided by IC devices U6 and U2, with input pin 14 of IC U2 coupled via a 100-K resistor to output pin 3 of IC U6, and also via a 68-K resistor to ground (voltage divider). The outputs of IC U2 are connected to the respective parallel inputs of shift register U3. The load signal from the controller U1 via gates U5A & B and amplifier U7C to pin 9 of the shift register U3 causes the word from the random generator U2 to be parallel loaded into the shift register U3. The clock signal at pin 10 of the shift register U3 causes the word to be shifted out serially at pin 3 (output O8).

The timer output from amplifier U7B is coupled via an electronic switch U9B and a 1-K resistor to the emitter of a relay driver transistor Q1. The collector of the transistor is connected via the coil of a relay 24 and a 1-K resistor to +15 volts. One set of normally open contacts of the relay connects the +15 volts to a light emitting diode 26 which is connected via 1-K resistor to ground, to provide a "system on" display. Another set of normally open contacts of the relay provides the timing output pulse to a jack for the video system control. Thee output from amplifier U7B is also connected to operate an electronic switch U9C, which connects +5 volts via a 680-ohm resistor to a light emitting diode 28, to provide a control pulse display.

A self test and self initialize network comprises a controller IC device U8, a momentary switch S2 which normally connects ground to pin 15 and when operated connects +5 volts thereto, a NOR gate U4D, an operational amplifier U7D, two light emitting diodes 32 and 34 each in series with a 680-ohm resistor, and an electronic switch U9D. The IC device U8 is a counter having its input at pin 14 connected to the timer output amplifier U7B, and its Q10 output at pin 11 connected to the control input of electronic switch U9B and also to an input of gate U4D. The other input of NOR gate U4D is grounded. The output of gate U4D is connected to the control input of electronic switch U9D and also via a 47-K resistor to buffer amplifier U7D. The output of amplifier U7D is connected to the junction of the resistors for light emitting diodes 32 and 34. Diode 32 is connected to +5 volts and diode 34 is connected to ground, so that one is on and the other is off depending upon the output of amplifier U7D. Diode 32 provides an "operate display" and diode 34 provides a "self test display". The electronic switch U9D is connected between the common junction point of the clock and a 1 K resistor to the junction of gates U4A and U4B. The self test controller operates as follows: At initial turn on (or reset by the momentary switch S2), counter U8 output at Q10 is low, causing solid state switch U9B to disconnect the output relay driver Q1 and to speed up the system clock by operating switch U9D to shunt the feedback networks by the small 1 K resistor. The system will then rapidly sequence through nine cycles after which output Q10 of IC U8 goes high, removing the shunt resistor from the clock, and reconnecting the relay driver Q1. Normal operation is then resumed.

Figure 3:
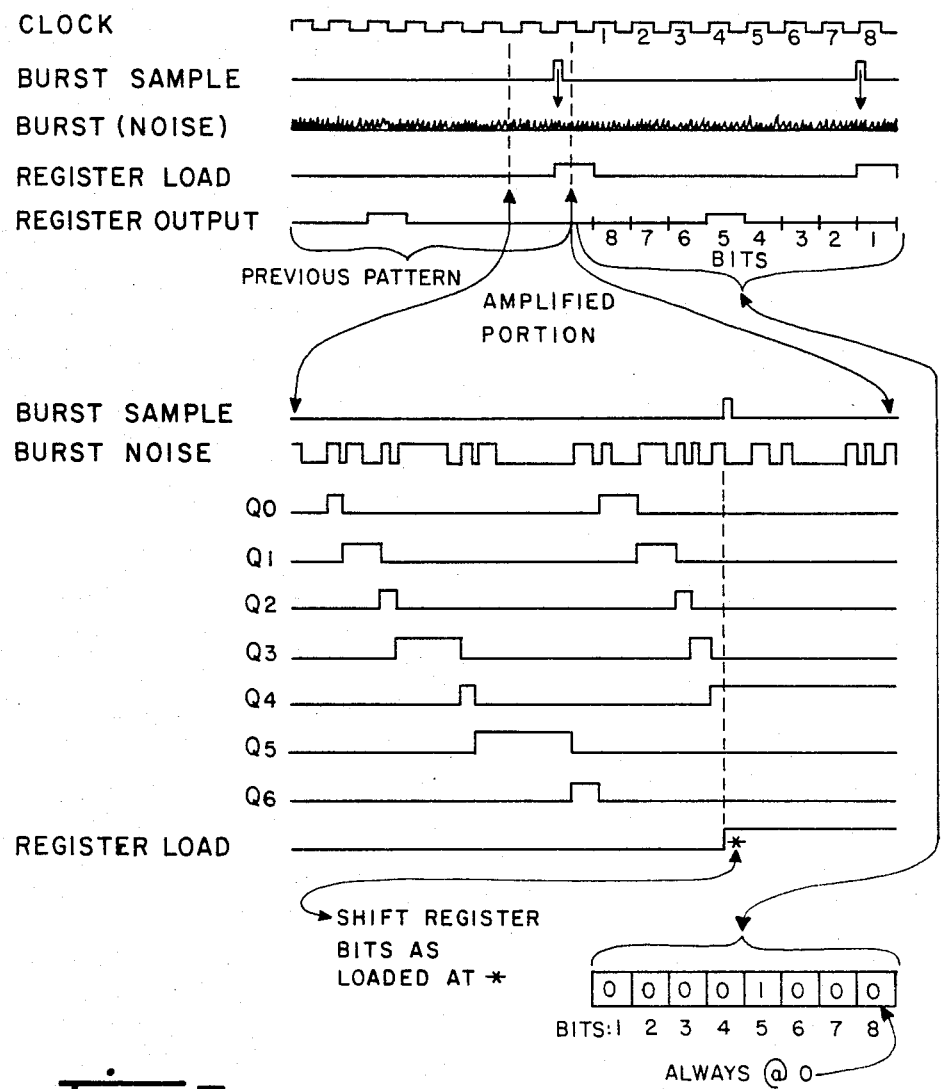
FIG. 3 is timing diagram.

The timing diagram for the system is shown in FIG. 3. Note that the frequency of the burst from the noise generator is many orders of magnitude larger than the frequency of the clock. No attempt was made to scale the drawing.

Figure 4:
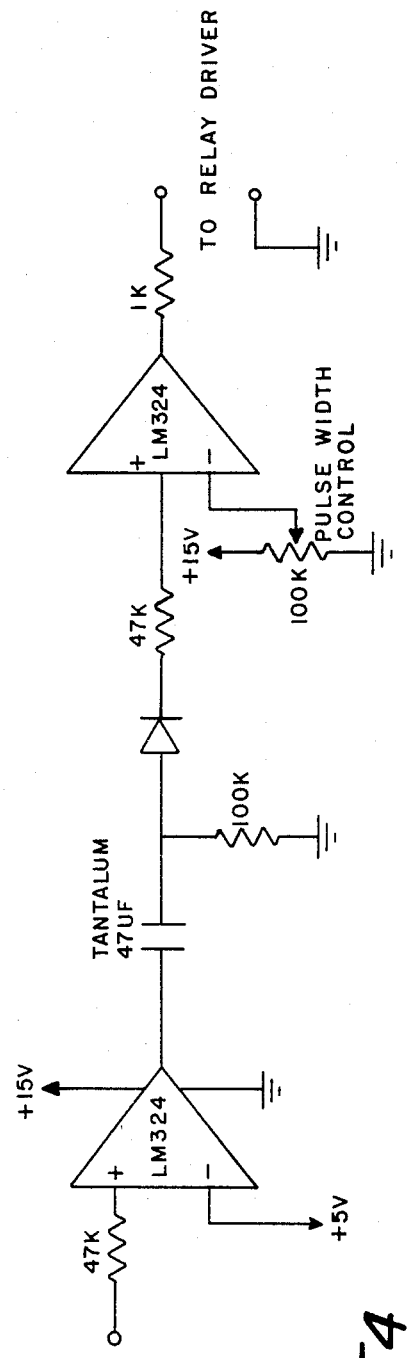
FIG. 4 is a functional block and schematic diagram of an optional pulse width control circuit.

An optional pulse width control circuit is shown in FIG. 4. Output pulse width control was not necessary for the application with the video system (Panasonic NV8030 VTR), which was designed to produce one frame per pulse regardless of pulse width. However, the simple pulse width control network (circuit shown) was tried with the timer system and was found effective in providing a wide variety of pulse widths. This network can be added to the system output stage to allow matching the system to equipment requiring specified pulse widths.

The power supply for the system is a simple +5-volt supply regulated by a UA7805 regulator IC. The +5-volt output is divided down to about +2.5 volts to provide bias for the LM324N operational amplifier sections. Separate +15-volt supply is provided to drive the noise generator U6 and the output relay and its driver transistor Q1.

The solid state devices shown in FIG. 2 may be of the following commercial types:

| Device | Type |
|---|---|
| U1, U2, U8 | CD4017AE |
| U3 | CD4021AE |
| U4 | CD4001BE |
| U5 | CD4011BE |
| U6 | MM5837N |
| U7 | LM324N |
| U9 | CD4066BE |
| Q1 | 40327 |

Thus, while preferred constructional features of the invention are embodied in the structure illustrated herein, it is to be understood that changes and variations may be made by the skilled in the art without departing from the spirit and scope of my invention.

I claim:

1. A timer system comprising: a clock providing pulses at a given frequency on a clock output lead, a first counter having a clock input connected to the clock output lead, the first counter having N stages continuously recycling, a digital noise generator, a second counter having a clock input connected to an output of the digital noise generator so that its outputs are sequentially high at a random frequency, the second counter being connected to continuously recycle, an N-stage shift register having parallel inputs one of which is connected to a fixed potential for a low logic level, the other parallel inputs being connected to different outputs of the second counter, the shift register having a load input connected to one output of the first counter so that the shift register is loaded at its parallel inputs on every Nth clock pulse with an N-bit word having one and only one stage high, the shift register having a clock input connected to the clock output lead so that the word appears bit by bit at a serial output, whereby time is divided into equal intervals with a pulse appearing at said serial output at random within each interval.

* * * * *